United States Patent [19]
Stobbe

[11] Patent Number: 6,070,803
[45] Date of Patent: Jun. 6, 2000

[54] READING DEVICE FOR A TRANSPONDER

[76] Inventor: Anatoli Stobbe, Steinradweg 3, D-30890 Barsinghausen, Germany

[21] Appl. No.: 09/027,652

[22] Filed: Feb. 24, 1998

Related U.S. Application Data

[63] Continuation of application No. 08/241,715, May 12, 1994.

[30] Foreign Application Priority Data

May 17, 1993 [DE] Germany ............... 43 16 468
Aug. 17, 1993 [DE] Germany ............... 43 27 642

[51] Int. Cl.$^7$ ................................................. G06K 19/06
[52] U.S. Cl. .................... 235/492; 235/384; 235/451; 343/895; 340/572
[58] Field of Search .................... 235/492, 451, 235/439, 472.02, 462.46, 383, 384, 385; 343/895, 742, 867; 340/572

[56] References Cited

U.S. PATENT DOCUMENTS

| | | |
|---|---|---|
| 4,364,043 | 12/1982 | Cole et al. .......... 340/825.54 |
| 4,388,524 | 6/1983 | Walton .................. 235/380 |
| 4,475,481 | 10/1984 | Caroll .................. 119/51 R |
| 4,600,829 | 7/1986 | Walton .................. 235/439 |
| 4,656,463 | 4/1987 | Anders et al. .......... 340/572 |
| 4,727,591 | 2/1988 | Manlove ............... 415/182 |
| 4,814,595 | 3/1989 | Gilboa .................. 235/492 |
| 4,918,296 | 4/1990 | Fujisaka et al. ....... 235/380 |
| 5,053,774 | 10/1991 | Schuermann et al. .... 342/44 |
| 5,103,222 | 4/1992 | Esch et al. .......... 340/572 X |
| 5,105,162 | 4/1992 | Fleissner et al. ...... 329/359 |
| 5,115,515 | 5/1992 | Yamamoto et al. ...... 455/71 |
| 5,146,613 | 9/1992 | Anderson .............. 455/78 |
| 5,218,343 | 6/1993 | Stobbe et al. .......... 340/572 |
| 5,347,263 | 9/1994 | Carroll et al. .......... 340/572 |
| 5,347,280 | 9/1994 | Schuermann ............. 342/42 |
| 5,351,052 | 9/1994 | D'Hont et al. ........... 342/42 |
| 5,365,235 | 11/1994 | Kennedy et al. .......... 342/44 |
| 5,406,275 | 4/1995 | Hassett et al. ....... 235/384 X |
| 5,438,699 | 8/1995 | Coveley ................ 455/67.4 |
| 5,446,447 | 8/1995 | Carney et al. ........ 340/572 |
| 5,450,086 | 9/1995 | Kaiser .................. 342/42 |
| 5,451,763 | 9/1995 | Pickett et al. .......... 235/492 |
| 5,491,715 | 2/1996 | Flaxl .................... 375/344 |
| 5,512,887 | 4/1996 | McAllister .......... 235/492 X |
| 5,548,821 | 8/1996 | Coveley ................ 455/67.4 |
| 5,821,525 | 10/1998 | Takebayashi ........... 235/492 |

FOREIGN PATENT DOCUMENTS 40 03 410 4/1992 Germany .
41 34 922 12/1992 Germany .

Primary Examiner—Michael G Lee
Attorney, Agent, or Firm—Burns, Doane, Swecker & Mathis, L.L.P.

[57] ABSTRACT

A reading device and one or more associated transponders are used for non-contact identification of persons or objects. When a transponder is moved into the vicinity of the reading device, the reading device receives and evaluates data sent from the transponder. To provide the maximum distance between the reading device (or the antenna thereof) and the transponder, an automatic tuning device is employed to adjust a resonant circuit of the reading unit to match or approximately match a resonance frequency (fo) of the transponder by tuning the reading unit to a preset frequency which matches the frequency (fo) of the transponder. The tuning unit compensates for external influences caused by the environment in which the reading unit is installed, thereby preventing the resonant circuit of the reading unit from deviating from the optimum resonance frequency of the transponder.

22 Claims, 5 Drawing Sheets

READING DEVICE FOR A TRANSPONDER

This application is a continuation of application Ser. No. 08/241,715, filed May 12, 1994, which is incorporated in its entirety herein by reference.

The invention relates to a reading device for a transponder.

BACKGROUND

Reading devices for transponders are known through the German patents DE 40 03 410 C2 and DE 41 34 922 C1. These reading devices are suitable for reading and programming without contact with the transponders of the kind described in the German patent DE 40 03 410 C2.

The field of application of these reading devices and associated transponders includes technology for identifying people, vehicles, possessions and other objects. The use of this technology has increased in recent years. Depending on the application, the transponders are attached to people, vehicles and possessions, etc., and detected by at least stationary readers.

Frequently persons carry the transponders on a key chain or in a trouser pocket or also in the breast pocket, when the transponder has the shape of a credit card.

The readers, which are allocated to the transponders, have an antenna which serves as the transmitting-receiving antenna, and an evaluating unit that is either separate from the antenna or integrated in the antenna. The evaluating unit serves, among other things, to evaluate the data received from the transponder.

The transponder does not have its own battery for energy supply. Rather it draws its energy from the energy transferred from the reader via the antenna to the transponder. The transmission of data from the transponder to the reader is also carried out via the antenna by means of absorption modulation.

Despite the fact that the transponder lacks its own energy supply, there is the desire with non-contact transponders to make the effective radius or distance between the reader and the transponder as large as possible. The larger the distance, the more convenient is a reading point. Thus a reader can be passed, for the purpose of identification without it being necessary, for example, to pull the briefcase or the key chain (in general that object that contains the transponder) out of one's clothes and to bring the object into the vicinity of the reader.

In everyday practice, electricians usually install the non-contact reading system. Frequently, when the reader is mounted stationarily, the antenna is installed on the building site at a predetermined reading point in the desired wall of the building concerned even before the final cleaning operation. Not until all of the other construction work has been completed, are the other components, viz. the other components of the reader and transponder, added and the entire system is put into service.

It has been demonstrated that there are always problems once the system is put into service. The antenna resonant circuit, which is associated with the antenna, comprises an inductance, designed as a coil, and a capacitance, formed by means of a capacitor. If such an antenna resonant circuit is attached, e.g., to or in a wall as a room antenna, the antenna resonant circuit is mistuned due to the capacitance of the wall. Thus, the antenna resonant circuit is no longer tuned to a preset resonance frequency.

Depending on the nature of the wall, the capacitance of the wall and thus also the mistuning of the antenna resonant circuit varies. This problem also applies to antennas embedded in a roadway or street. In this case, external influences such as moisture, ice, snow or also the general nature of the soil are responsible for the mistuning of the antenna of the reader.

This eventual mistuning of the antenna resonant circuit works against the goal of making the distance between transponder and reader as large as possible for identification. Namely if the antenna resonant circuit of the transponder and the antenna resonant circuit of the reader are not trimmed to maximum on the same resonance frequency, the coupling conditions between both antenna resonant circuits deteriorate. Even if the antenna of the reader is just slightly mistuned, the possible distance of the reader declines dramatically.

If, in contrast, the antenna resonant circuit of the reader is tuned in such a manner that it resonates on the same resonance frequency as the antenna resonant circuit of the transponder, the results are ideal coupling conditions owing to the overvoltage of resonance. These conditions allow a long read distance between the transponder and the reader.

Of course, it is already known to equip the reading device with a variable capacitor, in order to affect the antenna resonant circuit when the antenna becomes mistuned following installation and to adapt to the conditions of the location of installation, in order to thus again tune the antenna resonant circuit to the specified resonance frequency. However, the use of such variable capacitors has not been successful in everyday practice.

Rather experience has shown that the profession of installers or service technicians is overtaxed with the trimming work that has to be done. Rather this profession knows very little about the technical fields of antennas and high frequency technology, a state that results in this profession avoiding the after-tuning of the antenna resonant circuit with the aid of the variable capacitor. Not only is a screwdriver required for tuning, but also suitable meters such as field strength meters or an oscillograph with a special receiving antenna must be on hand; however, they are usually not available. In the final analysis, the necessary tuning of the installed antenna is not done. For these reasons there are hardly any non-contact systems with large frame antennas providing the desired long read distances of up to 1 m.

The invention remedies this drawback. The invention is directed towards the problem of providing a reading device of the aforementioned kind that enables long distances between the reading device and the transponder, using the reader and the transponder as prescribed.

This problem is solved by means of the present invention.

SUMMARY

The invention provides a reader with an automatic tuning unit, with which an antenna resonant circuit can be tuned automatically to a specified resonance frequency. If during installation of the antenna, for example, in a wall, the antenna resonant circuit, originally designed for the resonance frequency, becomes mistuned owing to the capacitance of this wall, the tuner provides that the antenna resonant circuit is automatically tuned again to the resonance frequency, thus eliminating the influence of the capacitance of the wall. The invention guarantees that the antenna resonant circuit is always optimally tuned independently of the external influences, without the need of an operator to perform any external tuning operations. Since it is ensured that the antenna resonant circuit of the transponder and the reader always oscillate on the same resonance frequency, there is ideal coupling conditions owing to the overvoltage of resonance. The conditions enables maximum read distance. Following the installation of the antenna of the reader, no additional measurements and trimming are required; rather these trimming operations are automated by means of the invention.

According to one advantageous embodiment of the invention, it is provided that the additional capacitances and/or inductances can be connected to the antenna resonant circuit by means of the tuning unit or the additional capacitances and/or inductances can be disconnected from the antenna resonant circuit. In this manner the capacitance values and/or inductance values defining the resonance frequency can be varied in a simple manner in order to automatically tune the antenna resonant circuit to the resonance frequency as a function of the external influences.

An especially expedient design of the invention provides that the capacitance of the resonant circuit capacitor of the antenna resonant circuit is dimensioned smaller than the capacitance corresponding to the resonance frequency of the antenna resonant circuit.

By means of these measures it is possible to modify the antenna resonant circuit capacitance in such a manner that the antenna resonant circuit can be tuned in both directions. Furthermore, it is expedient to choose the values of the additional capacitances and/or inductances in the sense of a binary graduation. In this manner, for example, a total of sixteen different capacitance values can be realized with four additional capacitances.

The invention allows in an advantageous manner the microprocessor that is assigned to the evaluating unit of the reader to be used for automatic tuning of the antenna resonant circuit, in addition to the usual evaluation of data. In addition, it is also possible to provide a separate tuning microprocessor within the automatic tuning unit.

In an expedient embodiment of the invention, the microprocessors can be programmed with an algorithm that allows the antenna resonant circuit to be automatically tuned to its resonance frequency. The algorithm finds the maximum of the resonant circuit voltage or the resonant circuit current according to the method of successive approximation which is known in itself and in which the maximum of the resonant circuit voltage or the resonant circuit current is approximated in a step-by-step manner. Thus, the resonant circuit capacitance is modified step-by-step until the resonant circuit voltage or the resonant circuit current exhibits the maximum.

According to another expedient embodiment of the invention, the antenna resonant circuit is tuned continuously and automatically to the resonance frequency.

Thus, it is achieved that the antenna resonant circuit is always optimally tuned, even if the external influences (e.g. moisture of the wall and thus the capacitance of the wall) change over the course of time.

The automatic continuous tuning is an important demand, for example, for parking places in parking garages, where the barrier at the exit is opened by means of a transponder, which is mounted on the bottom of the vehicle. Thus, the reader is situated in the roadway or in the ground.

In the described application of the non-contact identification system, the kind of vehicle that will be above the antenna is not predictable, and depending on the model of the car, the distance between the transponder and the reader will vary. As a consequence of the large iron mass of the car, the antenna resonant circuit is significantly mistined due to these variable distances. Therefore, it is especially advantageous if the separate microprocessor of the tuning unit performs continuously an automatic tuning of the antenna resonant circuit to the resonance frequency, so that any car can be identified reliably.

In another advantageous embodiment of the invention, the automatic tuning takes place only within a limited, selectable tuning range.

By means of this measure, the rate of the automatic tuning can be increased, so that the duration of the automatic tuning to the resonance frequency is very low. This feature is interesting for the above described case of identifying different types of vehicles exhibiting a variable distance between the transponder and the reading device. In this case, some extremely different types of cars with different distances above the roadway can be measured and then the microprocessor has only to be switched between a few values, instead of running through the entire tuning range.

Another expedient embodiment of the invention provides that the automatic tuning is done after the operating voltage of the reader has been switched on. In addition, however, it is also expedient to initiate the automatic tuning by operating a separate key. It is also advantageous to start the automatic tuning by means of a special switching signal sent by the transponder.

It is especially expedient within the scope of the invention, if the automatic tuning is conducted periodically at selectable time intervals. This embodiment is especially recommeded, if it is expected, owing to the local peculiarities, that the external influences causing the antenna resonant circuit to be mistuned will change only over prolonged periods of time.

Finally there is also the possibility of initiating the automatic tuning as a function of the quality of the signals of the transponder that are received from the reader, and especially if the quality of these signals falls below a prescribed tolerance limit, or if the signal shape of the data is poor or incomplete.

In summary, the invention provides a reading device for a non-contact identification system, which allows for large distances between the reading device and the transponder without disturbing the reliable functional operation of the system.

BRIEF DESCRIPTION OF THE DRAWINGS

In the following, the invention is explained in detail with reference to the embodiments shown in the drawings.

DETAILED DISCUSSION

Figure 1:
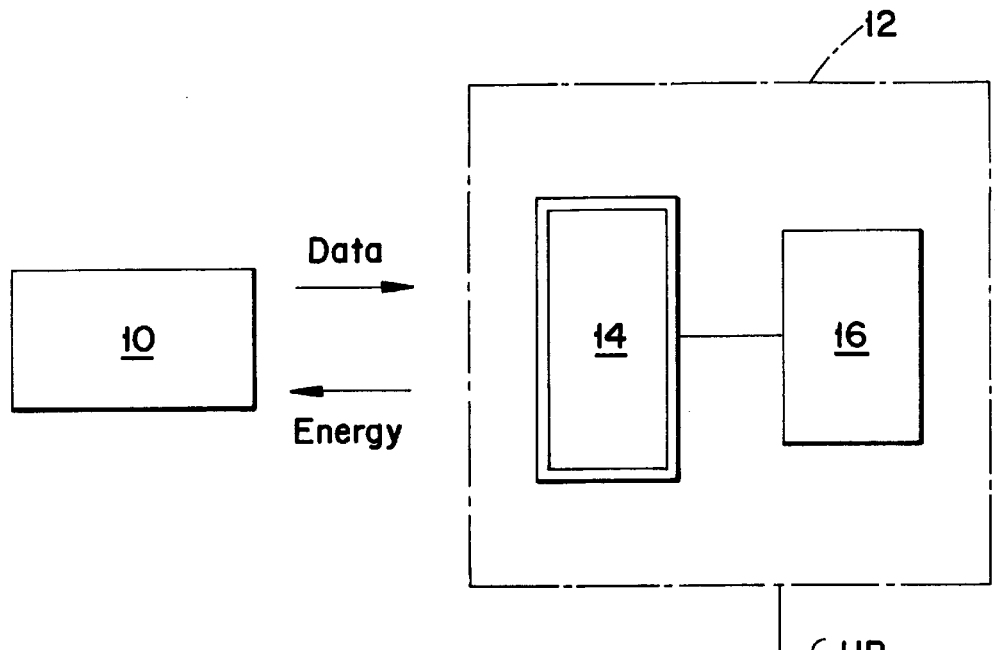
FIG. 1 is a schematic drawing of a non-contact identification system with a reading device and a transponder.
Figure 2:
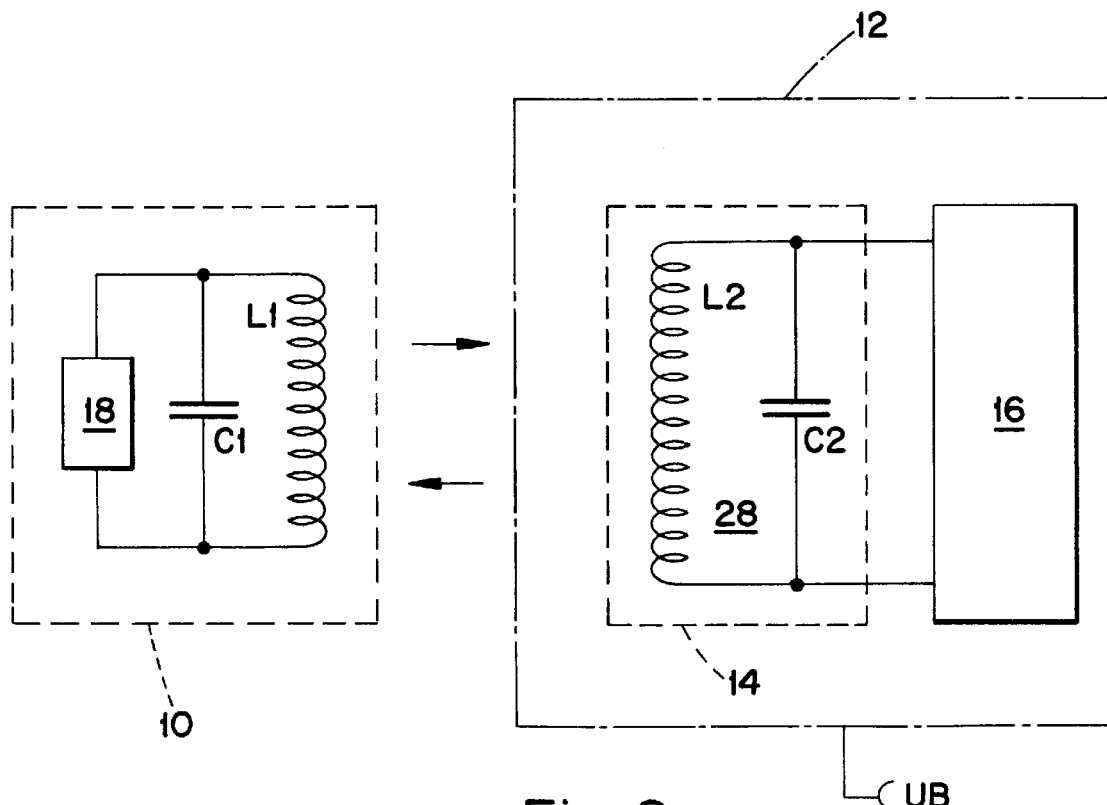
FIG. 2 is a somewhat detailed view of a transponder and a reading device according to FIG. 1.

FIGS. 1 and 2 show as a schematic a non-contact identification system, which comprises a known transponder 10 and a known reader 12. An exchange of data takes places between the transponder 10 and the reader 12. Since the transponder 10 does not have its own battery, energy is also transferred from the reader 12 to the transponder 10.

The known construction of the transponder 10 includes a chip 18 and a resonant circuit, formed by a capacitance C1 and by an inductance L1, as the antenna. This resonant circuit is tuned to the resonance frequency fo.

The reader 12 is fed with an operating voltage UB and has, as well-known, a frame antenna 14, which operates as a transmitting-receiving antenna, and an evaluating unit 16. The frame antenna forms an inductance L2, which represents together with a capacitance C2 the antenna resonant circuit.

Figure 3:
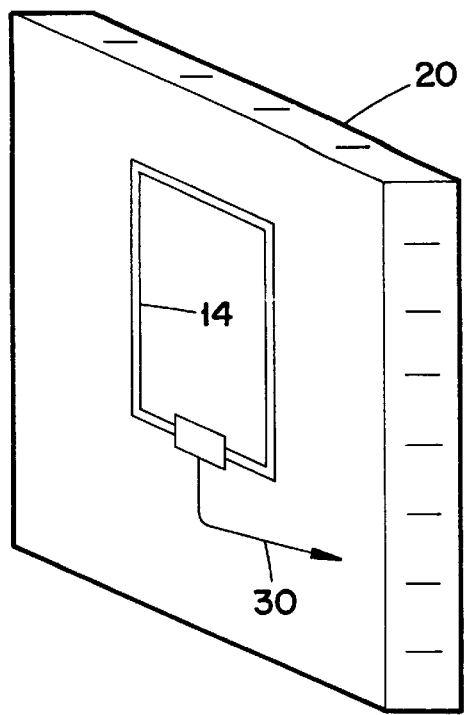
FIG. 3 is a schematic drawing of a frame antenna of a reader that is mounted on the wall.
Figure 4:
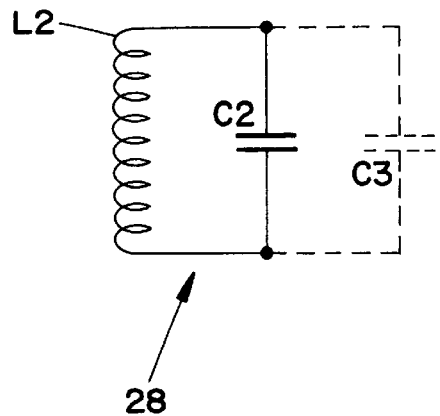
FIG. 4 shows an electric circuit diagram of an antenna resonant circuit of a reader in order to elucidate the capacitance of the wall shown in FIG. 3.

The drawing in FIG. 3 shows a frame antenna 14 of the reader 12, where the frame antenna 14 is mounted on or in a wall 20 and is connected via an electric line 30 to the evaluating unit 16 (not illustrated here). The capacitance C3 of the wall 20 is shown in FIG. 4 by means of the capacitor, which is shown with a dashed line. The antenna resonant circuit, which comprises L2 and C2 and which thus no longer exhibits the resonance frequency fo, is mistuned owing to this capacitance C3. This mistuning of the antenna resonant circuit 28 results in the transponder 10 having to be a very short distance from the reader 12 or the frame antenna 14, in order to guarantee a reliable mode of operation.

Figure 5:
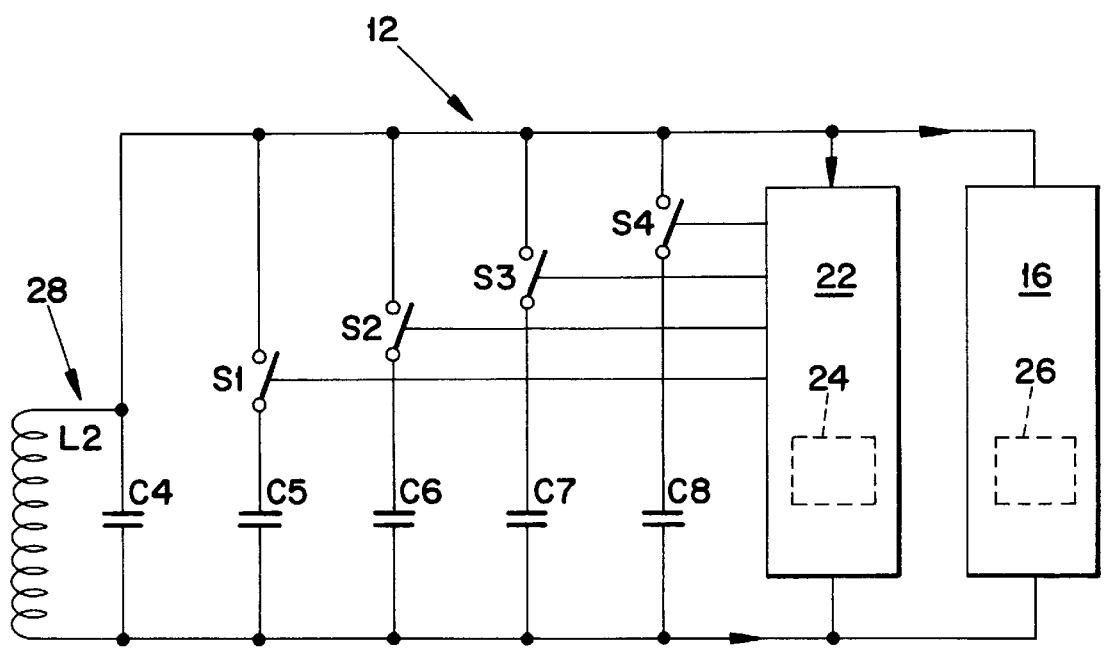
FIG. 5 is a schematic circuit diagram of a reader with an automatic tuning unit.

FIG. 5 is a schematic drawing of a reader 12 with an automatic tuning unit 22 in order to tune automatically the antenna resonant circuit 28 to the resonance frequency fo. The antenna resonant circuit 28 includes the inductance L2 and the capacitance C4. The value of the capacitance C4 is dimensioned smaller than the value that is required in the case of the inductance L2 for the resonance frequency fo. Parallel to the capacitance forming the resonant circuit capacitor C4 are additional capacitors C5–C8, which can be switched on or off individually or in combination via electronic switches S1–S4. The electronic switches S1–S4 can be realized by means of field effect transistors.

Since the capacitance values can be changed in this manner, the antenna resonant circuit 28 is tuned in such a manner that it resonates on the resonance frequency fo or at least in the immediate vicinity of this resonance frequency fo. The capacitance that is effective in total for the antenna resonant circuit 28 can be changed and adjusted by means of a separate microprocessor 24 of the automatic tuning unit 22. For this purpose, the microprocessor 24 can be programmed with an algorithm that allows the antenna resonant circuit to be tuned to the maximum or to the resonance frequency fo by suitably driving and operating the electric switches S1–S4. The algorithm can be realized in a simple manner, after the resonance frequency fo has been specified and the capacitance values of the additional capacitors C5–C8 are known, and after the voltage at the antenna resonant circuit 28 during the feeding operation with the resonance frequency fo has been measured and evaluated.

The value of the capacitance C4 shown in FIG. 5 is dimensioned smaller than necessary for the resonance frequency fo. Thus, in FIG. 5 the antenna resonant circuit 28 can be tuned in both directions, as a function of whether the actual resonance frequency defined by the inductance L2 and the capacitance C4 lies above or below the specified resonance frequency fo.

The values of the additional capacitors C5–C8 are selected in the sense of a binary graduation, so that with the four capacitors C5–C8 a total of sixteen different capacitance values can be realized. It is assumed that the antenna resonant circuit 28 was tuned originally in air (prior to installation of the frame antenna 14 into the wall 20) to the resonance frequency fo and that the capacitance C2 (cf. FIG. 2) has a value of 1,000 pf. In the case of the reader shown in FIG. 5 the resonant circuit capacitor C4 is then selected with a smaller value of 850 pf.

With the aid of the additional capacitors C5–C8, the effective capacitance of the antenna resonant circuit 28 can be changed now between 850 pf and 1,150 pf. This corresponds to a tuning range of 1,000 pf±150 pf, at a resolution of 20 pf. If these steps of 20 pf are not adequate or if the screening is too large, other binary steps can be added or in general the individual values of the steps can be changed so that a universal adaptation to the different conditions is possible. In particular, the number of additional capacitors C5–C8 can be changed.

It was assumed in the preceding description of the embodiment according to FIG. 5 that the microprocessor 24 of the automatic tuning unit 22 is used for the automatic tuning. However, it is also possible within the scope of the invention to utilize the microprocessor 26, which is a component of the reader 12 or the evaluating unit 16, for the automatic tuning. Thus, an automatic tuning of the antenna resonant circuit 28 can be initiated, for example, when the reader 12 is put into service and connected to the operating voltage UB and the microprocessor 26 is not yet needed for the actual data processing of the information received from the transponder 10.

Figure 6:
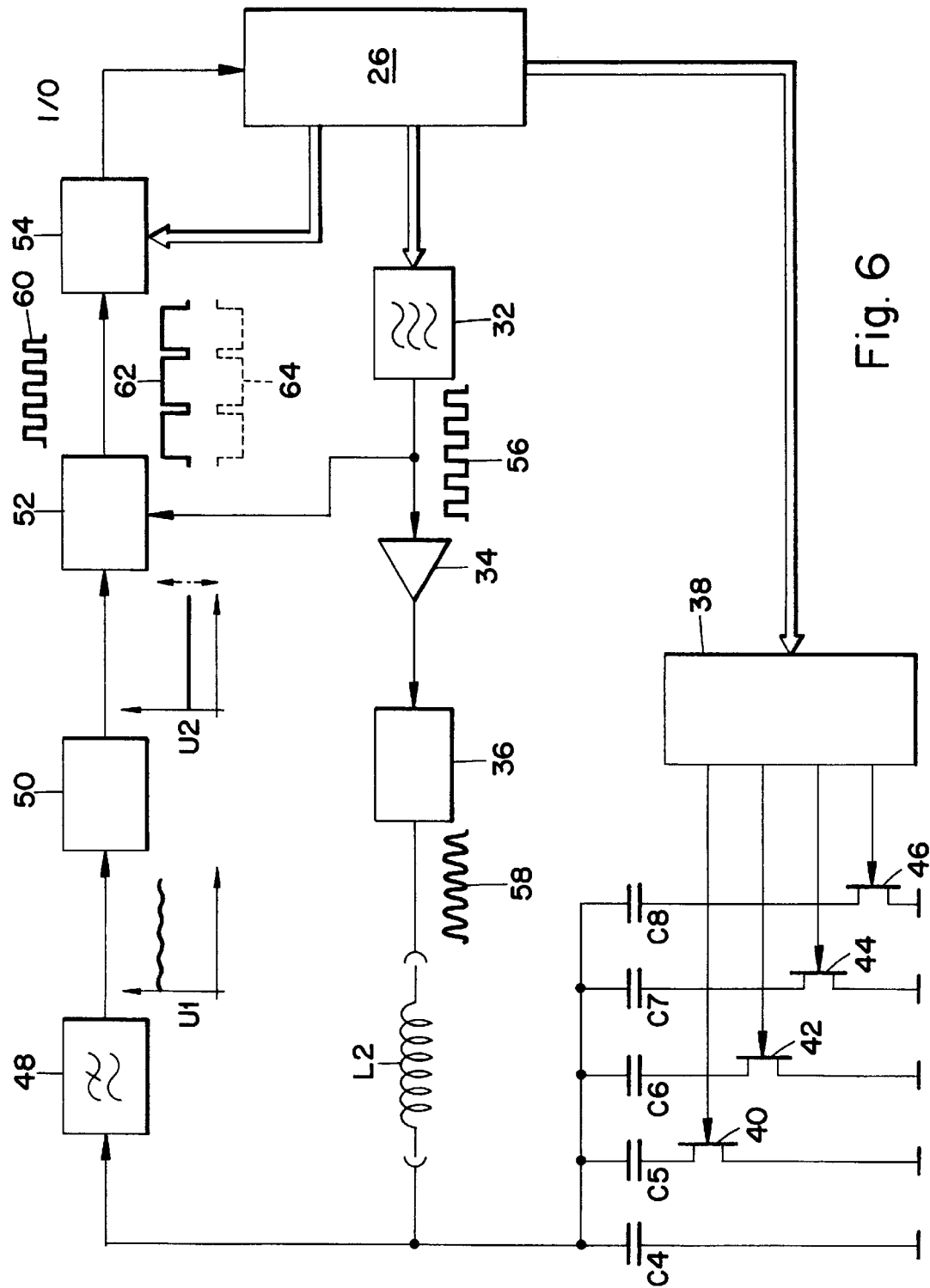
FIG. 6 is a schematic circuit diagram of the automatic tuning of an antenna resonant circuit.
Figure 7:
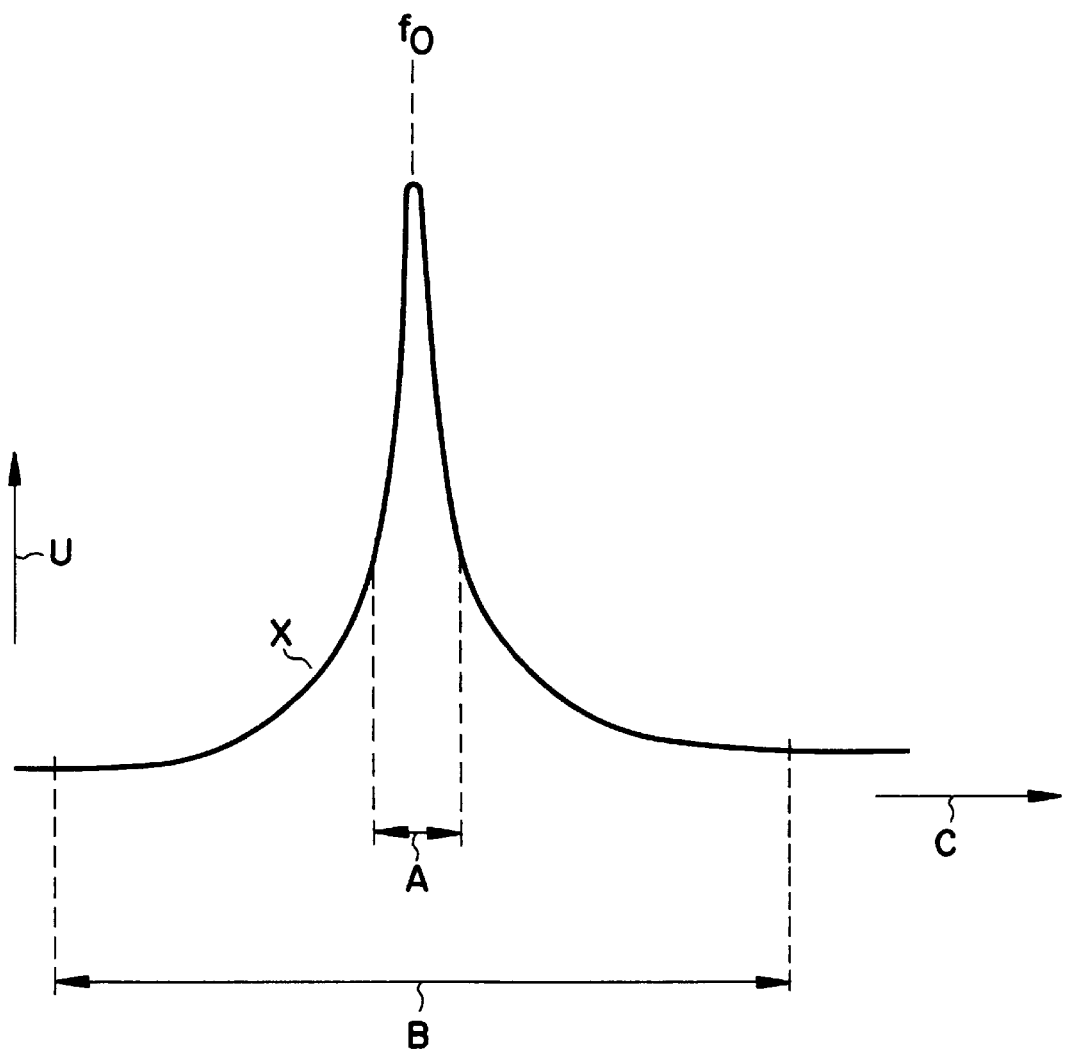
FIG. 7 is a drawing of the curve of the resonant circuit voltage as a function of the resonant circuit capacitance.

In the following, an automatic tuning is explained in detail with reference to FIGS. 6 and 7. FIG. 6 shows a schematic block diagram, and FIG. 7 shows in the form of a resonance curve the resonant circuit voltage U for a varying resonant circuit capacitance C. Two different step widths are shown there. The step width A reproduces a tuning range with 16 steps, corresponding to the use of four switchable additional capacitors C5–C8. The other step width B reproduces a larger tuning range with altogether 128 steps (in this case seven additional capacitors are necessary).

In FIG. 6 an oscillator 32 generates pulses 56 with the resonance frequency fo. These pulses 56 travel via a high frequency amplifier 34 to a filter 36 (pi-type filter), to whose output is applied a sinusoidal voltage 58 with the resonance frequency fo, which feeds the antenna coil L2.

The resonant circuit voltage U occurring at the antenna resonant circuit is fed to a low pass filter 48 with a rectifier, so that the illustrated equipolar voltage U1, which still exhibits some undulation, appears at the output of the low pass filter 48. The voltage U1 is processed via a differentiator 50, thus resulting in the differentiated d.c. voltage U2, which is released from the high voltage portion and which is fed to an amplitude comparator 52, which is also fed by the oscillator 32.

The amplitude-comparator 52 is followed by a pulse filter 54, whose output has either the digital signal "1" or "0"; and these digital signals are sent to the microprocessor 26. It in turn feeds the amplitude-comparator 52, the oscillator 32 and a switch control 38. The switch control 38 takes over the driving of the four field effect transistors 40, 42, 44 and 46 for switching on and off the four additional capacitors C5–C8.

As FIG. 7 shows, the resonant circuit voltage U changes as a function of the resonant circuit capacitance C, whereby the resonant circuit voltage U reaches its maximum at the resonance frequency fo or the related capacitance value C. Thus, by determining the maximum of the resonant circuit voltage, the capacitance C can be determined or adjusted by switching the additional capacitors C5–C8.

The automatic tuning conducted thus can be done by searching for the maximum, e.g. according to the well-known method of successive approximation, thus achieving a step-by-step approximation. For example, it is assumed that the resonant circuit capacitance C is so small that one is at the point X on the resonance curve in FIG. 7. By changing the resonant circuit capacitance C one can then find that when the resonant circuit capacitance C increases, the resonant circuit voltage U also increases, and thus one is within the rising portion of the resonance curve with positive rise.

If in the assumed case there is positive rise in the resonance curve and an increase in the values of the resonant circuit capacitance C, the result is a rise in the d.c. voltage U2 at the output of the differentiator 50; and the original voltage 60 assumes at the output of the amplitude-comparator 52 a course according to the signal voltage 62. Thus, the signal voltage 62 comprises largely "1" signals.

The signal voltage 62 is processed by the pulse filter 54, which suppresses pulses below a selectable pulse duration. The result is that the digital signal "1", which thus indicates that the resonant circuit voltage U rises as the capacitance values of the resonant circuit capacitance C increases, appears at the output of the pulse filter 54.

If, as the resonant circuit capacitance C increases, the maximum of the resonant circuit voltage U is exceeded at the resonance frequency fo and consequently the resonant circuit voltage U decreases again and one is in the right part of the resonance curve in FIG. 7 with negative slop, then the d.c. voltage U2 also decreases and the signal voltage 64, which is shown with a dashed line, appears at the output of the amplitude comparator 52. Then the digital signal "0" appears at the output of the pulse filter 54.

Thus, the maximum of the resonant circuit voltage U can be found in the manner described with the automatic tuning by means of the switchable additional resonant circuit capacitors C5–C8, and the associated desired resonant circuit capacitance C can be automatically adjusted. The associated resonance curve according to FIG. 7 was plotted using the circuit arrangement according to FIG. 6.

Of course, the invention can also be used for such readers that not only read the data sent by the transponder but can also program the transponder. Above all, when programming the transponder, optimal tuning between the transponder, and the frame antenna or the reader is necessary because maximum current is required for the programming operation in order to change the memory cells in the transponder accordingly. This maximum current is obtained preferably when the two antenna resonant circuits of the transponder and the reader are tuned together to the resonance frequency.

Figure 8:
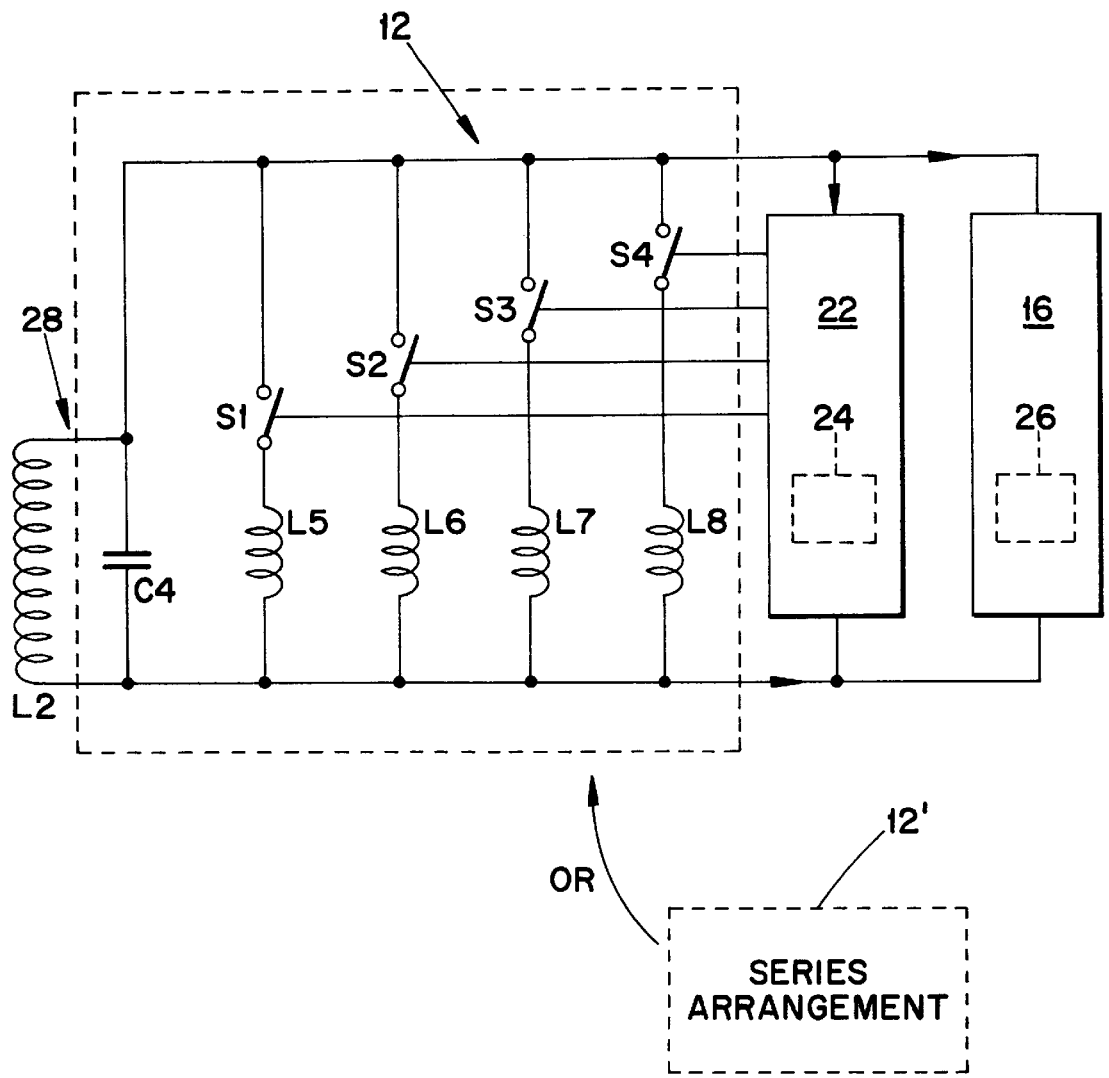
FIG. 8 is a schematic circuit diagram of a reader with an automatic tuning unit employing inductors.

The implementation of the idea of automatic tuning according to the invention is, moreover, independent of whether the antenna resonant circuit of the reader is designed as a series resonant circuit or parallel resonant circuit. Furthermore, instead of capacitors, the circuit shown in FIG. 5 may use inductors, as shown in FIG. 8. The circuit shown in FIG. 8 may be designed as a parallel circuit or a series circuit.

What is claimed is:

1. A reading device for interacting with at least one transponder having a transponder resonant circuit exhibiting a transponder resonance frequency (fo), said reading device comprising:

a reading device resonant circuit which is designed as a reading device antenna and a reading device resonant circuit capacitor, said reading device resonant circuit being tuned to said resonance frequency (fo); and an automatic tuning unit connected to said reading device resonant circuit for automatically tuning said reading device resonant circuit to said resonance frequency (fo) of said reading device by adjusting said reading device resonant circuit to compensate said reading device resonant circuit for external influences on said reading device resonant circuit;

at least one adjustment element for altering the operating characteristics of said reading device resonant circuit; and wherein said automatic tuning unit includes means for selectively connecting and disconnecting said at least one adjustment element to said reading device resonant circuit based on a state of said reading device resonant circuit;

wherein said automatic tuning unit defines a value such that said operating characteristics of said reading device resonant circuit are changed by incrementing or decrementing said value to tune said reading device resonant circuit to said resonance frequency (fo);

wherein said at least one adjustment element includes at least one inductor or at least one capacitor.

2. A reading device as claimed in claim 1, wherein a capacitance of the reading device resonant circuit is selected to be smaller than a capacitance corresponding to the resonance frequency (fo).

3. A reading device as claimed in claim 1, wherein an inductance of the reading device resonant circuit is selected to be smaller than an inductance corresponding to the resonance frequency (fo).

4. A reading device as claimed in claim 1, further comprising:

wherein said means for selectively connecting or disconnecting includes at least one switch for controlling whether said at least one adjustment element is connected to said reading device resonant circuit, according to instructions from said automatic tuning unit.

5. A reading device as claimed in claim 4, wherein said at least one switch includes a plurality of switches each having either an on or off state, wherein said on or off state of said plurality of switches defines a binary number as said value, further wherein said operating characteristics of said reading device resonant circuit are changed by incrementing or decrementing said binary number.

6. A reading device as claimed in claim 5, wherein said at least one adjustment element comprises at least one inductor element.

7. A reading device as claimed in claim 4, wherein a capacitance of the reading device resonant capacitor is selected to be smaller than a capacitance corresponding to the resonance frequency (fo).

8. A reading device as claimed in claim 4, wherein an inductance of the reading device resonant circuit is selected to be smaller than an inductance corresponding to the resonance frequency (fo).

9. A reading device as claimed in claim 4, wherein said at least one adjustment element comprises at least one capacitor element.

10. A reading device as claimed in claim 1, wherein the reading device includes an evaluating unit with an evaluating unit microprocessor for automatic tuning of the reading device resonant circuit and for evaluating data read from said at least one transponder.

11. A reading device as claimed in claim 10, wherein the automatic tuning unit comprises a separate tuning unit tuning microprocessor.

12. A reading device as claimed in claim 11, wherein the evaluating unit and tuning unit microprocessors are programmed with an algorithm that automatically tunes said reading device resonant circuit to its resonance frequency (fo).

13. A reading device as claimed in claim 12, wherein the algorithm for the automatic tuning of the reading device resonant circuit incrementally tunes said resonant circuit to the preset frequency by finding the maximum of a resonant circuit voltage or a resonant circuit current according to a method of successive approximation.

14. A reading device as claimed in claim 11, wherein the separate microprocessor of the tuning unit continuously conducts an automatic tuning of the reading device resonant circuit to the resonance frequency (fo).

15. A reading device as claimed in claim 1, wherein the automatic tuning takes place only within a limited, selectable tuning range.

16. A reading device as claimed in claim 1, wherein the automatic tuning is done after the operating voltage of the reader has been switched on.

17. A reading device as claimed in claim 1, wherein the automatic tuning is started in response to a switching signal sent by the at least one transponder.

18. A reading device as claimed in claim 1, wherein the automatic tuning is conducted periodically at selectable time intervals.

19. A reading device as claimed in claim 1, wherein the automatic tuning is started in response to the receipt of signals at said reading device having poor quality.

20. A reading device as claimed in claim 1, wherein the reading device resonant circuit is configured as a parallel resonant circuit.

21. A reading device as claimed in claim 1, wherein the antenna resonant circuit is designed as a series resonant circuit.

22. The reading device of claim 1, wherein said reading device includes an oscillator which generates a signal having the resonance frequency (fo) which remains substantially constant.

* * * * *